United States Patent
Miyajima et al.

(10) Patent No.: US 10,969,408 B2
(45) Date of Patent: Apr. 6, 2021

(54) CURRENT MEASURING DEVICE

(71) Applicant: KOA CORPORATION, Ina (JP)

(72) Inventors: Soya Miyajima, Nagano (JP); Ryo Osawa, Nagano (JP); Yoji Kobayashi, Nagano (JP)

(73) Assignee: KOA CORPORATION, Nagano (JP)

( * ) Notice: Subject to any disclaimer, the term of this patent is extended or adjusted under 35 U.S.C. 154(b) by 208 days.

(21) Appl. No.: 16/313,366

(22) PCT Filed: May 25, 2017

(86) PCT No.: PCT/JP2017/019498
§ 371 (c)(1),
(2) Date: Dec. 26, 2018

(87) PCT Pub. No.: WO2018/003360
PCT Pub. Date: Jan. 4, 2018

(65) Prior Publication Data
US 2019/0162757 A1 May 30, 2019

(30) Foreign Application Priority Data

Jun. 27, 2016 (JP) .............................. JP2016-126616

(51) Int. Cl.
| G01R 31/02 | (2006.01) |
| G01R 15/14 | (2006.01) |
| H01C 1/144 | (2006.01) |
| H01C 13/00 | (2006.01) |
| G01R 15/00 | (2006.01) |

(Continued)

(52) U.S. Cl.
CPC ........... *G01R 15/146* (2013.01); *G01R 1/203* (2013.01); *G01R 15/00* (2013.01); *G01R 19/0092* (2013.01); *H01C 1/144* (2013.01); *H01C 13/00* (2013.01)

(58) Field of Classification Search
USPC ......................................... 324/117 R, 117 H
See application file for complete search history.

(56) References Cited

U.S. PATENT DOCUMENTS 8,810,235 B2  8/2014 Ueno et al.
10,082,542 B2  9/2018 Tanaka et al.
(Continued)

FOREIGN PATENT DOCUMENTS

CN   105324673 A   2/2016
JP   2011-053061 A   3/2011
(Continued)

OTHER PUBLICATIONS

Office Action in Japan Application No. 2016-126616, dated Feb. 24, 2021, 4 pages.

*Primary Examiner* — Vincent Q Nguyen
(74) *Attorney, Agent, or Firm* — Brinks Gilson & Lione

(57) ABSTRACT

Provided is a current measuring device for measuring current, including a conductor adapted to pass current therethrough, at least a pair of voltage sensing terminals arranged apart from each other on the conductor in the current flowing direction, and a substrate to which the voltage sensing terminals are connected. The substrate is long in the current flowing direction, and connection portion of the substrate that are connected to the voltage sensing terminals are arranged closer to one end side of the substrate in the lengthwise direction.

6 Claims, 5 Drawing Sheets

(51) Int. Cl.
*G01R 1/20* (2006.01)
*G01R 19/00* (2006.01)

(56) References Cited

U.S. PATENT DOCUMENTS

| | | |
|---|---|---|
| 2004/0155644 A1* | 8/2004 | Stauth .................. G01R 15/207 |
| | | 324/117 R |
| 2011/0050222 A1 | 3/2011 | Ueno et al. |
| 2015/0309080 A1 | 10/2015 | Chae et al. |
| 2015/0355244 A1 | 12/2015 | Sato |
| 2016/0139209 A1 | 5/2016 | Tanaka et al. |
| 2017/0003322 A1 | 1/2017 | Nakamura et al. |
| 2017/0199084 A1 | 7/2017 | Kimura |
| 2017/0261536 A1 | 9/2017 | Chae et al. |
| 2019/0178917 A1* | 6/2019 | Shimizu .................. G01R 33/07 |

FOREIGN PATENT DOCUMENTS

| | | |
|---|---|---|
| JP | 2012-181208 A | 9/2012 |
| JP | 2013-174555 A | 9/2013 |
| JP | 2015-210272 A | 11/2015 |
| WO | WO 2014/203465 A1 | 12/2014 |
| WO | WO 2015/115596 A1 | 8/2015 |
| WO | WO 2016/042732 A1 | 3/2016 |

* cited by examiner

CURRENT MEASURING DEVICE

This application is a 371 application of PCT/JP2017/019498 having an international filing date of May 25, 2017, which claim priority to JP2016-126616 filed Jun. 27, 2016, the entire content of each of which is incorporated herein by reference.

TECHNICAL FIELD

The present invention relates to a current measuring device.

BACKGROUND ART

Patent Literature 1, for example, discloses a structure of a circuit board, which incorporates a shunt resistor and a temperature detection circuit, disposed in a case. Such a structure can detect current flowing through a battery (or cells), for example, so as to detect the charged state of the battery.

CITATION LIST

Patent Literature

Patent Literature 1: JP 2013-174555 A

SUMMARY OF INVENTION

Technical Problem

For example, there may be cases were electronic components for processing detection signals, such as a microcomputer and an amplifier, are mounted on the aforementioned circuit board incorporating the temperature detection circuit.

However, mounting electronic components on a circuit board with the conventional structure can result in an increased device size, which is problematic.

It is an object of the present invention to reduce the size of a current measuring device and increase the mountability of electronic components thereon.

Solution to Problem

According to an aspect of the present invention, there is provided a current measuring device for measuring current, including a conductor adapted to pass current therethrough (which may be a resistor including electrode terminals and a resistive element, or a bus bar without a resistive element), at least a pair of voltage sensing terminals arranged apart from each other on the conductor in the current flowing direction, and a substrate to which the voltage sensing terminals are connected. The substrate is long in the current flowing direction, and connection portions of the substrate that are connected to the voltage sensing terminals are arranged closer to one end side of the substrate in the lengthwise direction.

Since the connection portions are arranged closer to one end side of the substrate, a space can be secured on the other end side.

The pair of voltage sensing terminals are preferably arranged closer to the one end side of the substrate. Accordingly, a balance between the pair of voltage sensing terminals and the substrate can be secured.

The current measuring device preferably further includes an electronic component mounted on the substrate on a side opposite to the one end side of the substrate.

The substrate preferably has a width less than or equal to that of the conductor. The difference between the widths is preferably about the thickness of the case.

The current measuring device preferably further includes a base arranged between the conductor and the substrate. Setting the width of the conductor equal to that of the case can provide a smooth appearance without bulges.

The current measuring device further preferably includes a fixing portion on the conductor on a side opposite to the one end side of the substrate, the fixing portion being adapted to fix the conductor and the substrate together.

Since the fixing portion is arranged closer to the one end side of the substrate in the lengthwise direction, the fixing portion can achieve fixation with a good balance with the fixing portion for the voltage sensing terminals.

The present specification incorporates the disclosure of JP Patent Application No. 2016-126616 that forms the basis of the priority claim of the present application.

Advantageous Effects of Invention

According to the present invention, the size of a current measuring device can be reduced and the mountability of electronic components thereon can be increased.

DETAILED DESCRIPTION OF THE PREFERRED EMBODIMENTS

Hereinafter, a current measuring device in accordance with an embodiment of the present invention will be specifically described with reference to an example of a resistor with a butt joint structure that is obtained by butt-joining end faces of a resistive element and electrodes, based on the accompanying drawings. It should be noted that the resistor may also have a structure in which a resistive element and electrodes are connected on their surfaces.

In this specification, a direction in which an electrode, a resistive element, and another electrode of a resistor are arranged in this order shall be referred to as a "lengthwise direction," and a direction crossing the lengthwise direction shall be referred to as a "width direction."

First, a current measuring device in accordance with an embodiment of the present invention will be described.

Figure 1:
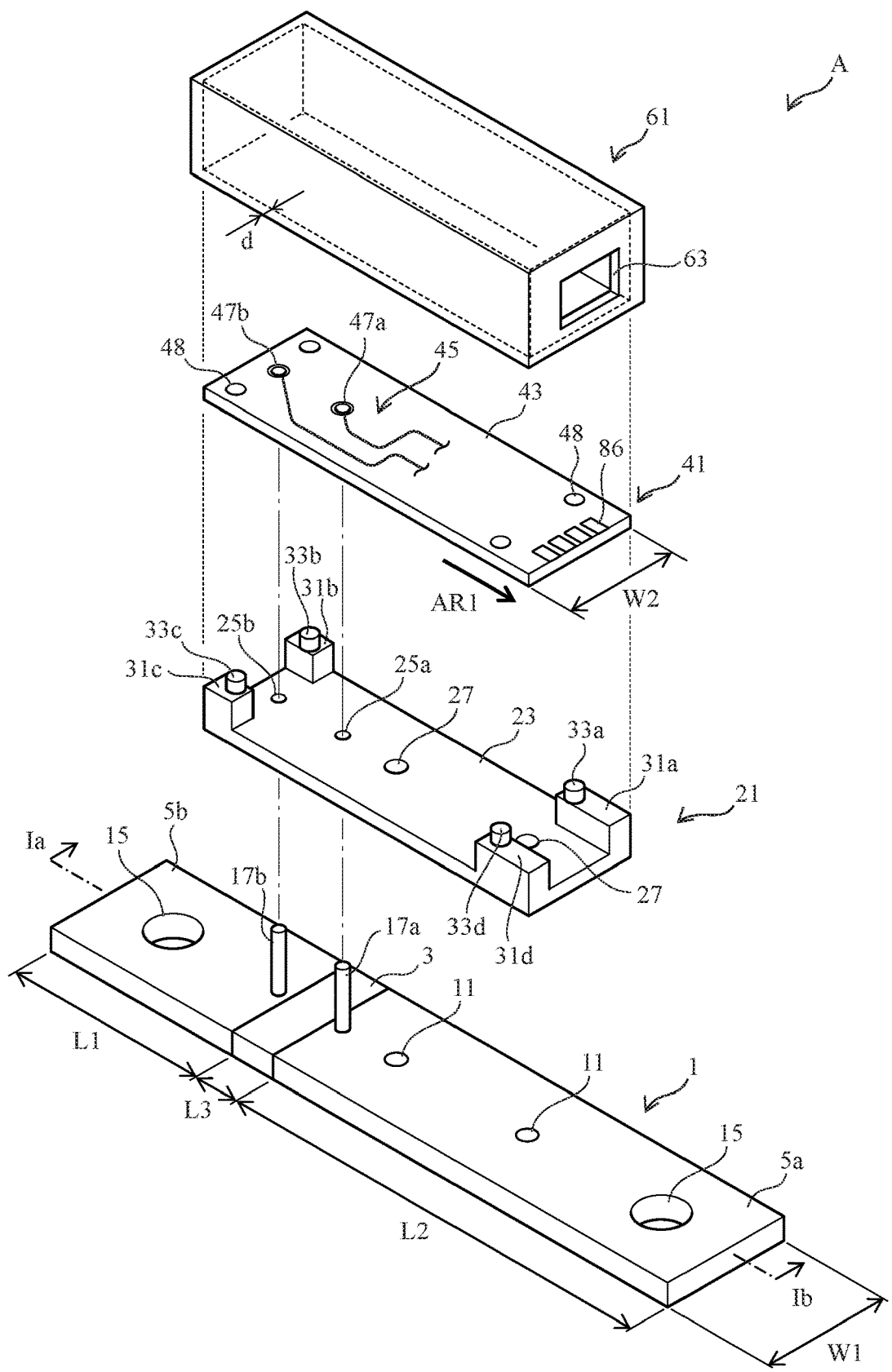
FIG. 1 is an exploded perspective view of an exemplary configuration of a current measuring device in accordance with an embodiment of the present invention.
Figure 2:
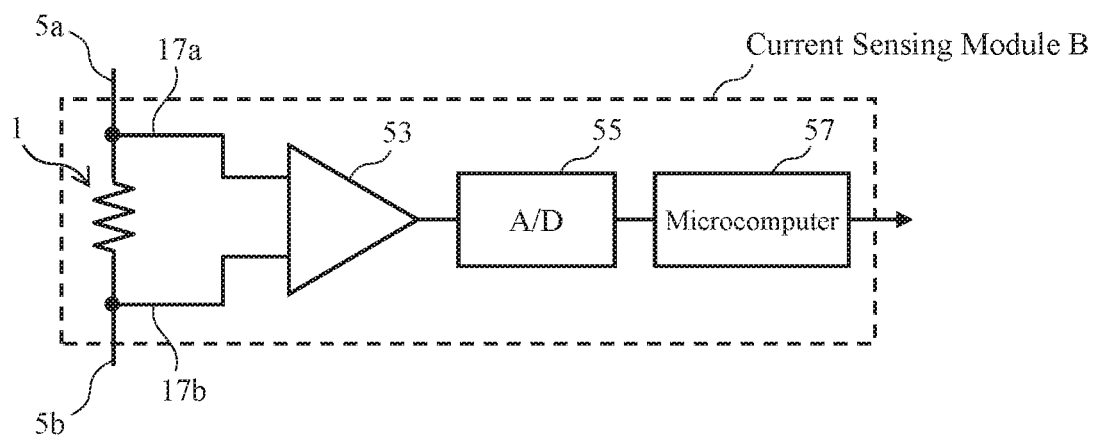
FIG. 2 is a diagram illustrating an exemplary circuit configuration corresponding to the current measuring device of FIG. 1.
Figure 4:
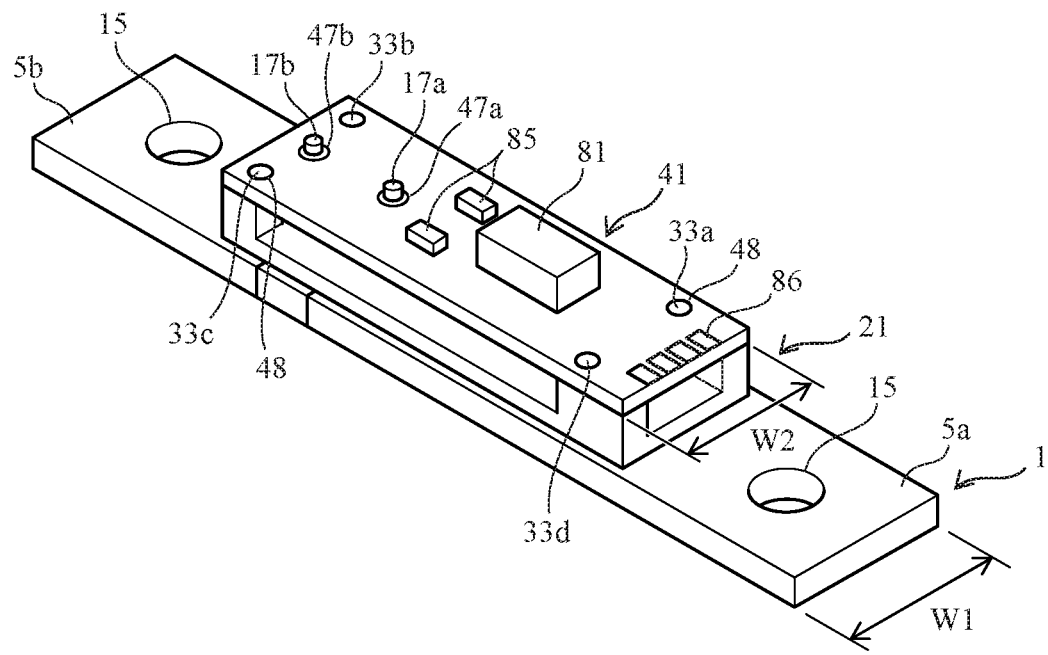
FIG. 4 is a view illustrating an exemplary structure obtained by fixing a substrate to the structure of FIG. 3B.
Figure 5:
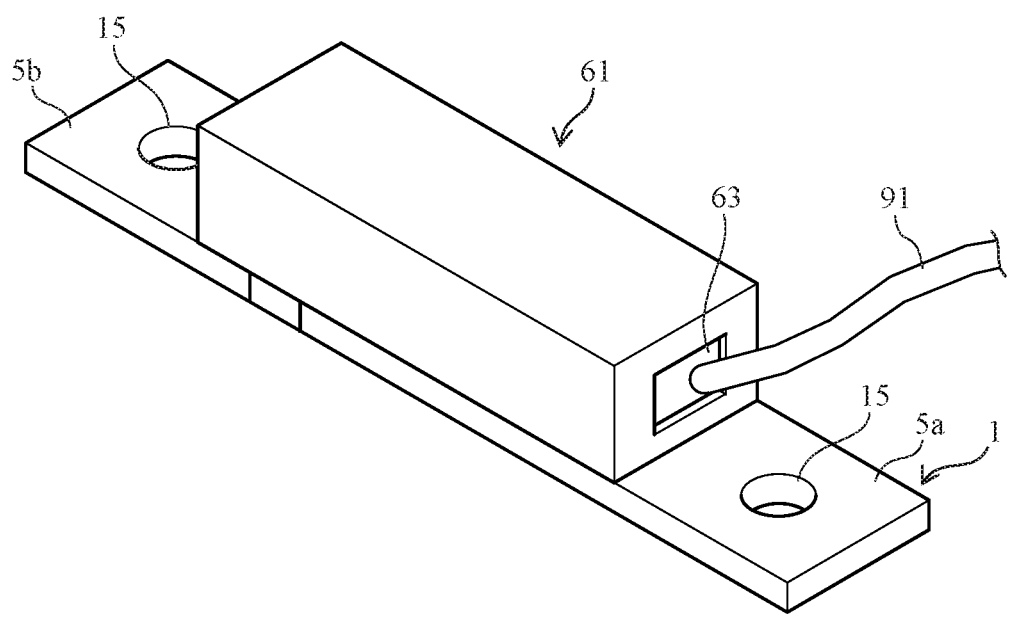
FIG. 5 is a view illustrating an exemplary structure obtained by attaching a case to the structure of FIG. 4.
Figure 6:
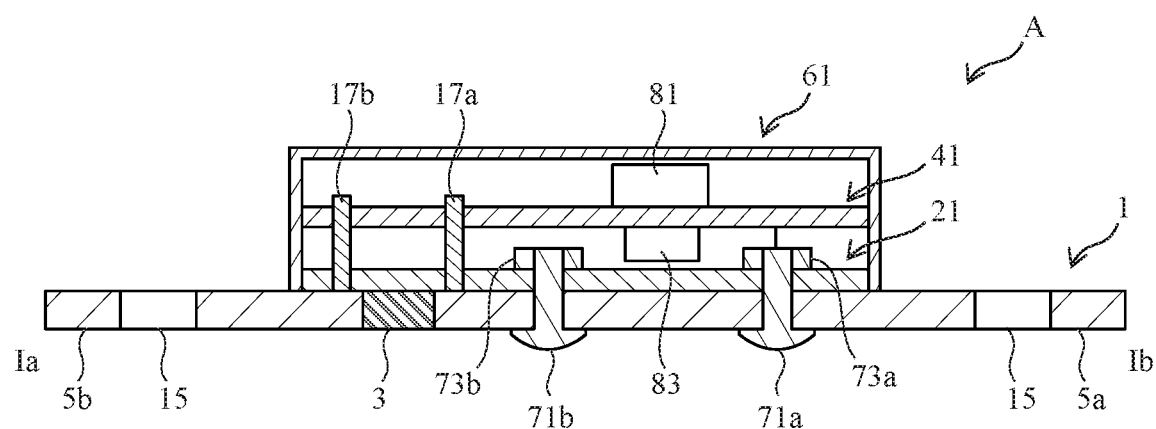
FIG. 6 is a cross-sectional view of the current measuring device in accordance with an embodiment of the present invention.

FIG. 1 is an exploded perspective view of an exemplary configuration of a current measuring device in accordance with an embodiment of the present invention. FIG. 2 is a diagram illustrating an exemplary circuit configuration corresponding to the current measuring device of FIG. 1. FIGS. 3, 4, and 5 are perspective views each illustrating an exemplary configuration of each part in FIG. 1. FIG. 6 is a cross-sectional view of the assembled current measuring device along line Ia-Ib shown in FIG. 1.

As illustrated in FIG. 1, a current measuring device A in accordance with this embodiment includes a shunt resistor 1, a base 21 arranged thereon, a substrate 41 arranged thereon, and a case 61 that houses the underlying components from the top side. The current measuring device A senses current flowing through a battery (cells) to detect the state of the battery, for example. The shunt resistor 1 includes terminals 5a and 5b adapted to connect to current paths so that current to be measured flows through the terminals 5a and 5b, and generates a potential difference in accordance with changes in the amount of current. Then, the state of the battery is detected from a voltage drop generated in the shunt resistor 1.

The shunt resistor (hereinafter referred to as a "resistor") 1 has a butt joint structure obtained by, for example, butt-joining the end faces of a resistive element 3 and the first and second electrodes (i.e., the pair of terminal portions) 5a and 5b. For the resistive element 3, a resistive material, such as a Cu—Ni, Ni—Cr, or Cu—Mn-based material can be used. For the electrodes 5a and 5b, a material such as Cu can be used. The joined portions of the resistive element 3 and the electrodes 5a and 5b can be formed using electron beam welding, laser beam welding, cladding, or brazing with metallic nano paste, for example.

The resistor 1 in accordance with this embodiment further includes voltage sensing terminal 17a and 17b that rise from the plate-like electrodes 5a and 5b, respectively. In this example, the electrodes 5a and 5b are arranged close to the boundaries between the electrodes 5a and 5b and the resistive element 3, respectively.

The length of the resistive element 3 is a length L3 for attaining a target resistance value. Herein, provided that the length of the electrode 5a is L2 and the length of the electrode 5b is L1, L2>L1 is satisfied.

The substrate 41, such as a printed board, is disposed on the resistor 1 with the base 21 (which will be described later) interposed therebetween.

The substrate 41 has formed therein holes for passing the voltage sensing terminals 17a and 17b, and has connection portions 47a, 47b to be electrical connected to the voltage sensing terminals 17a and 17b from the upper side, respectively, using solder and the like. The connection portions 47a and 47b connect to one ends of wires 45, respectively, for example, so that voltage can be detected via the wires 45 as described below.

The substrate 41 is long in the current flowing direction (i.e., the lengthwise direction AR1) of the resistor 1, and the connection portions 47a and 47b are arranged not in the center of the substrate in the lengthwise direction but in positions closer to one end side of the AR1 (on the side opposite to the direction of the arrow AR1 in FIG. 1). Terminals 86 for extracting signals to the outside are provided at the other end side of the substrate 41. Further, through-holes 48 are provided at the four corners of the substrate 41.

The case 61 has an opening 63 on its lateral face on the side opposite to the one end side.

The width W2 of the substrate 41 is less than or equal to the width W1 of the resistor. Setting the width of the substrate 41 narrower than that of the resistor 1 can reduce the size of the case 61 described below and reduce the size of the current measuring device as a whole.

The positions of the voltage sensing terminals 17a and 17b of the resistor 1 in the lengthwise direction (AR1) are set off the center, corresponding to the off-center positions of the voltage connection terminals in the substrate 41 in the lengthwise direction. As illustrated in FIG. 4, the substrate 41 can be positioned on the center of the resistor 1 in the lengthwise direction AR1 in a state in which the resistor 1, the base 21, and the substrate 41 are put together.

In FIG. 1, reference numeral 15 denotes bolt holes such as holes through which the resistor 1 can be fastened to a bus bar and the like. Reference numeral 11 denotes holes through which the substrate 41 for sensing current are fastened to the resistor 1 with the base 21 interposed therebetween. The holes 11 and 11 are formed in the electrode 5a.

Next, the base 21 functioning as a supporting member for fixing the resistor 1 and the substrate 41 together will be described.

The base 21 includes leg portions 31a to 31d provided at the four corners of a plate 23, and columnar protrusions 33a to 33d provided on the upper faces (on the substrate 41 side) of the leg portions 31a to 31d, respectively, for example. Further, the plate 23 has formed therein through-holes 25a and 25b for passing the voltage sensing terminals 17a and 17b, respectively, and through-holes 27 and 27 for passing bolts described below.

FIG. 2 is a diagram illustrating an exemplary circuit configuration corresponding to the current measuring device of FIG. 1.

A current measuring device (i.e., a current sensing module) B illustrated in FIG. 2 corresponds to the aforementioned shunt resistor 1 and substrate 41, for example, and includes an amplifier 53 that amplifies a voltage signal between the two terminals 5a and 5b of the shunt resistor 1 via the voltage sensing terminals 17a and 17b, an A/D converter 55 that performs A/D conversion on the amplified signal from the amplifier 53, and a microcomputer 57 that performs an operation upon receiving a digital signal output. In FIG. 1, the amplifier 53 and the like are omitted.

When the device is on, the voltage level acquired by the voltage sensing terminals 17a and 17b of the current sensing resistor 1 is amplified and converted into digital data, and then, the value of current flowing through the battery is computed by the microcomputer 57. The current value is sent to various electrical devices (not illustrated) via data buses and the like. Accordingly, the state of the battery can be detected with high accuracy.

Figure 3A:
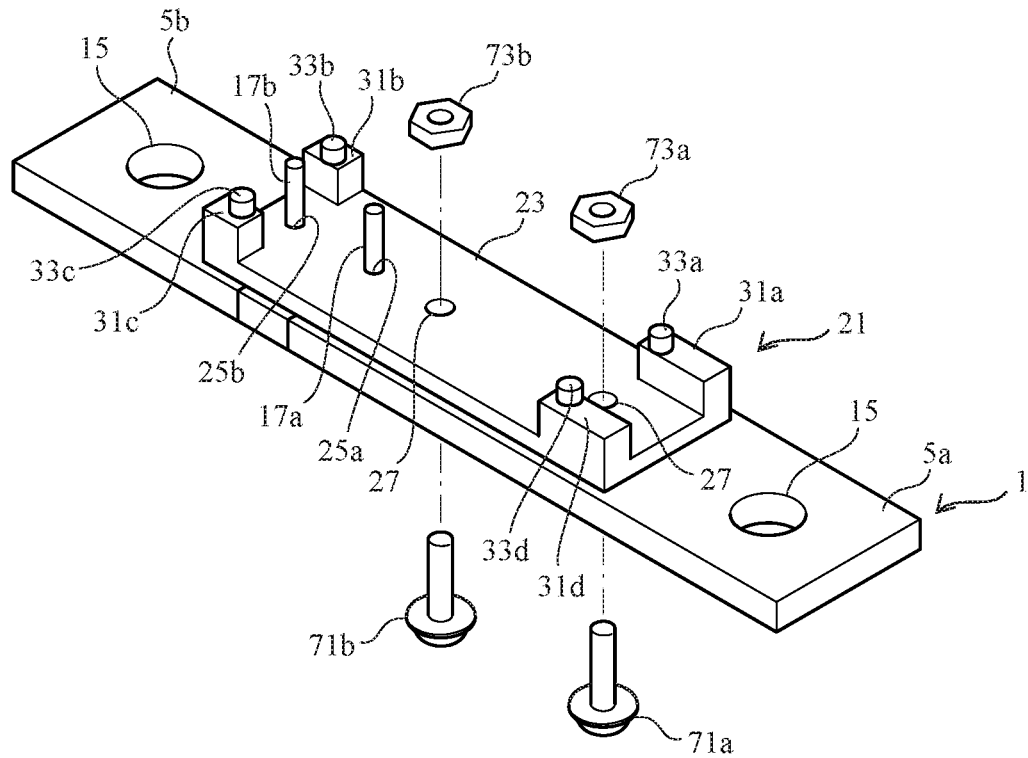
FIGS. 3A and 3B are perspective views of a resistor and a base that are connected.
Figure 3B:
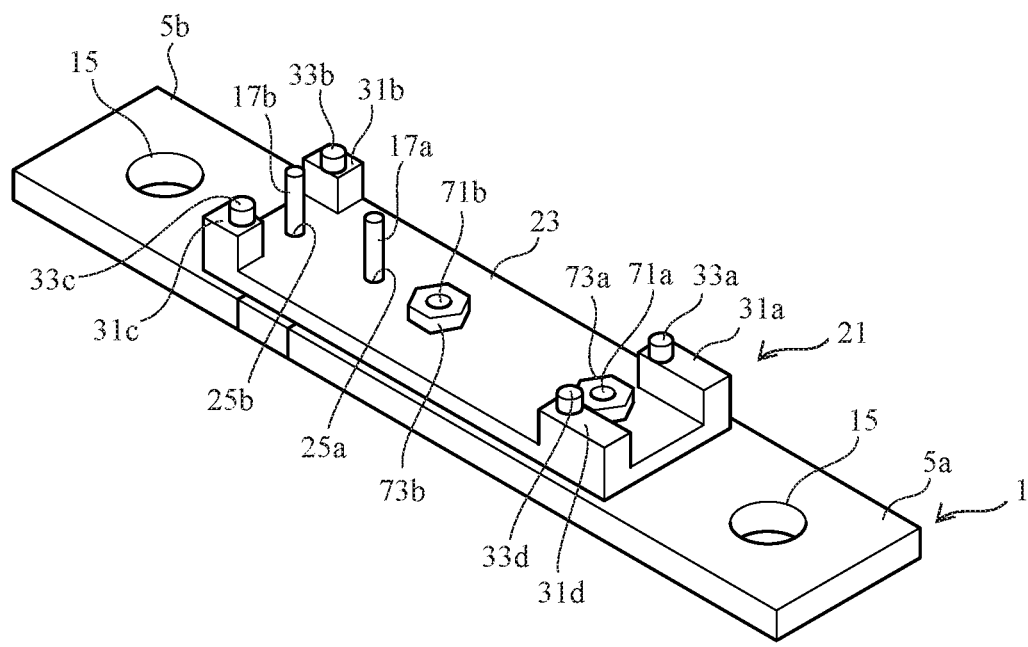

FIGS. 3A and 3B are perspective views of the resistor 1 and the base 21 that are connected.

As illustrated in FIG. 3A, the base 21 is positioned and arranged on the resistor 1 so that the voltage sensing terminals 17a and 17b are inserted through the through-holes 25a and 25b, respectively. The two through-holes 25a and 25b function as alignment holes.

Next, bolts 71a and 71b are inserted through the respective holes 11 and 11 and through-holes 27 and 27, and are then screwed with nuts 73a and 73b. In such a fixing structure, the substrate 41 and the base 21 are fastened together at a position closer to a side opposite to the one end side of the substrate 41. Specifically, as the position of the fixing portion, one bolt 71a is fixed at an end on the side opposite to the one end side of the substrate 41, and the other bolt 71b is fixed in the center of the base 21. Accordingly, as illustrated in FIG. 3B, the resistor 1 and the base 21 can be securely fastened together using the bolts 71a and 71b and the nuts 73a and 73b while being positioned with respect to each other.

Next, after the structure of FIG. 3B is assembled, the substrate 41 is fastened to the base 21 as illustrated in FIG. 4. That is, the protrusions 33a to 33d are embedded in the respective through-holes 48 of the substrate 41. If the heights of the protrusions 33a to 33d are set equal to the thickness of the substrate 41, the distal end faces of the protrusions 33a to 33d can be made flush with the surface of the substrate in the state of FIG. 4.

In such a state, the voltage sensing terminals 17a and 17b connected to the connection portions 47a and 47b, respectively, are long enough to slightly protrude beyond the upper face of the substrate 41.

Herein, since the voltage sensing terminals 17a and 17b are arranged closer to the one end side of the substrate 41 in the lengthwise direction, there is an empty space in a region from the center to the other end side of the substrate 41. Therefore, for example, various electronic components 81 and 83 for processing signals on the basis of a potential difference obtained from the resistor 1 can be mounted in such an empty space.

Signals extracted from the terminal portion 86 for extraction of output signals from the electronic components 81 and 83 can be transmitted to a processing unit, such as an ECU, for example, by a cable 91 that is passed through the opening 63 as illustrated in FIG. 5.

As described above, when the width W2 of the substrate 41 is set narrower than the width W1 of the resistor 1 by an amount corresponding to the thickness d of the case 61 (see FIG. 1), for example, the widths of the resistor 1 and the case 61 can be set equal, and thus, a structure without bulges can be obtained as illustrated in FIG. 5.

As also illustrated in the cross-sectional view of FIG. 6, the substrate and the base can be fastened together with the bolts 71a and 71b and the nuts 73a and 73b in the empty space that is formed in the region from the center to the other end side of the substrate 41, while the electronic components 81 and 83 and the like can be mounted in at least one of an empty space on the upper face side of the substrate 41 or an empty space on the lower face side thereof. Examples of the components mounted herein include an amplifier, an A/D converter, a temperature correction circuit, and a microcomputer.

When the voltage sensing terminals 17a, 17b of the resistor 1 are arranged in a region from one end to the center of the resistor 1, and the connection portions of the substrate for connection to the voltage sensing terminals are also arranged in such a region, an empty space can be formed, and the case 61 can be arranged on substantially the center of the resistor 1 in the lengthwise direction.

Although the resistor 1 was used in the aforementioned embodiment, a bus bar may also be used instead of the resistor. That is, a target to be attached to the substrate 41 with the base 21 interposed therebetween may be any conductor that can detect a potential difference. For example, a bus bar can be used instead of the resistor.

As described above, according to the current sensing device in accordance with this embodiment, the size of the current measuring device can be reduced. Therefore, the current measuring device is unlikely to be obstructive even when it is attached to a battery. Further, electronic components can be easily mounted on the current measuring device. Since the current measuring device is protected by its case, it is resistant to shocks and thus can also be attached to automobiles and the like.

In the aforementioned embodiments, configurations and the like illustrated in the accompanying drawings are not limited thereto, and can be changed as appropriate within the range that the advantageous effects of the present invention can be achieved. Besides, the present invention can be implemented by being changed as appropriate within the spirit and scope of the present invention.

Each configuration of the present invention can be selected or not selected as appropriate, and an invention that includes the selected configuration(s) is encompassed by the present invention.

INDUSTRIAL APPLICABILITY

The present invention is applicable to current sensing devices.

All publications, patents, and patent applications cited in this specification are all incorporated by reference into this specification.

What is claimed is:

1. A current measuring device for measuring current, comprising:
    a conductor adapted to pass current therethrough in a current flowing direction of the conductor;
    a pair of voltage sensing terminals provided directly on the conductor and arranged apart from each other in the current flowing direction; and
    a substrate secured to the conductor such that the pair of voltage sensing terminals are connected directly to the substrate, wherein the substrate is extensive in the current flowing direction of the conductor between two ends of the substrate, and the substrate is provided with connection portions configured to connect to the pair of voltage sensing terminals, and wherein the connection portions of the substrate are located in the substrate at locations closer to one end of the substrate in the current flowing direction than the other end of the substrate.

2. The current measuring device according to claim 1, wherein the pair of voltage sensing terminals are connected to the substrate at locations closer to the one end of the substrate in the current flowing direction than the other end of the substrate.

3. The current measuring device according to claim 2, further comprising an electronic component mounted on the substrate at a location closer to the other end of the substrate than the one end thereof.

4. The current measuring device according to claim 1, wherein the substrate has a width less than or equal to a width of the conductor, wherein the width of the substrate and the width of the conductor are aligned with each other in a direction perpendicular to the current flowing direction.

5. The current measuring device according to claim 1, further comprising a base arranged between the conductor and the substrate.

6. The current measuring device according to claim 1, further comprising a fixing portion formed in the conductor at a location between the pair of voltage sensing terminals and the other end of the substrate in the current flowing direction, the fixing portion being formed to fasten the conductor and the substrate together.

* * * * *